(12) United States Patent
Takai et al.

(10) Patent No.: US 12,229,925 B2
(45) Date of Patent: *Feb. 18, 2025

(54) MEDICAL INFORMATION PROCESSING APPARATUS AND MEDICAL INFORMATION PROCESSING METHOD

(71) Applicant: CANON MEDICAL SYSTEMS CORPORATION, Tochigi (JP)

(72) Inventors: Hiroshi Takai, Nasushiobara (JP); Kensuke Shinoda, Otawara (JP); Nobuyuki Konuma, Utsunomiya (JP); Masahito Nambu, Utsunomiya (JP)

(73) Assignee: CANON MEDICAL SYSTEMS CORPORATION, Tochigi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/304,012

(22) Filed: Apr. 20, 2023

(65) Prior Publication Data

US 2023/0260088 A1 Aug. 17, 2023

Related U.S. Application Data

(62) Division of application No. 16/845,176, filed on Apr. 10, 2020, now Pat. No. 11,669,938.

(30) Foreign Application Priority Data

Apr. 10, 2019 (JP) .............................. 2019-075110
Apr. 8, 2020 (JP) .............................. 2020-069908

(51) Int. Cl.
*G06T 5/70* (2024.01)
*G01R 33/56* (2006.01)
*G01R 33/561* (2006.01)

(52) U.S. Cl.
CPC ............ *G06T 5/70* (2024.01); *G01R 33/5608* (2013.01); *G01R 33/5611* (2013.01); *G06T 2207/10088* (2013.01)

(58) Field of Classification Search
CPC ........... G06T 5/002; G06T 2207/10088; G06T 2207/10072; G06T 2207/10081;
(Continued)

(56) References Cited

U.S. PATENT DOCUMENTS 11,199,598 B2 * 12/2021 Biber ................. G01R 33/3614
2009/0093709 A1 * 4/2009 Patel .................. G01R 33/5611
600/411

(Continued)

FOREIGN PATENT DOCUMENTS

CN 109493951 A 3/2019
EP 3 410 392 A1 12/2018
(Continued)

OTHER PUBLICATIONS

U.S. Appl. No. 62/991,269 specification, Mar. 18, 2020. (Year: 2020).*

(Continued)

*Primary Examiner* — Jose L Couso
(74) *Attorney, Agent, or Firm* — Oblon, McClelland, Maier & Neustadt, L.L.P.

(57) ABSTRACT

A medical information processing apparatus according to an embodiment includes processing circuitry. The processing circuitry calculates noise intensity from first data acquired during a first scan. The processing circuitry calculates a denoising intensity used for a denoising process based on the noise intensity and the difference between an imaging condition for the first scan and an imaging condition for a second scan, the denoising process being applied to second data obtained by the second scan.

19 Claims, 4 Drawing Sheets

(58) Field of Classification Search
CPC ............. G06T 2207/30004; G06T 5/50; G06T 7/0014; G06T 7/0016; G06T 7/0012; G06T 2207/20182; G01R 33/5608; G01R 33/5611; G01R 33/565; G01R 33/56341; G01R 33/5602; G06V 10/24; G06V 10/25; G06V 10/30; A61B 5/055; A61B 5/7203

See application file for complete search history.

(56) References Cited

U.S. PATENT DOCUMENTS

| | | | |
|---|---|---|---|
| 2011/0019935 A1* | 1/2011 | Kelm .................... | G06T 5/70 |
| | | | 382/275 |
| 2011/0156706 A1* | 6/2011 | Stubbs ................ | A61B 5/7203 |
| | | | 324/318 |
| 2012/0313640 A1 | 12/2012 | Pfeffer | |
| 2013/0194265 A1 | 8/2013 | Rehwald | |
| 2013/0315463 A1* | 11/2013 | Vilsmeier ............ | G01R 33/565 |
| | | | 382/131 |
| 2014/0177803 A1 | 6/2014 | Stevens | |
| 2014/0203808 A1 | 7/2014 | Hwang | |
| 2014/0226890 A1 | 8/2014 | O'Brien | |
| 2015/0139516 A1 | 5/2015 | Hwang | |
| 2015/0276908 A1 | 10/2015 | Takeshima | |
| 2016/0104279 A1 | 4/2016 | Li | |
| 2016/0274205 A1* | 9/2016 | Stemmer ............. | G01R 33/543 |
| 2017/0023657 A1 | 1/2017 | Tomoda | |
| 2017/0128025 A1* | 5/2017 | Chen ................... | A61B 5/0263 |
| 2018/0120404 A1 | 5/2018 | Novikov et al. | |
| 2018/0349759 A1 | 12/2018 | Isogawa et al. | |
| 2019/0005686 A1 | 1/2019 | Liu | |
| 2019/0033409 A1 | 1/2019 | Huang | |
| 2019/0066297 A1* | 2/2019 | Middlebrooks ......... | G06T 7/248 |
| 2019/0086496 A1* | 3/2019 | Moeller ................ | G06T 7/0012 |
| 2019/0104940 A1 | 4/2019 | Zhou | |
| 2019/0180482 A1 | 6/2019 | Takahashi | |
| 2019/0209867 A1 | 7/2019 | Sun et al. | |
| 2019/0369196 A1* | 12/2019 | Edelman .......... | G01R 33/56509 |
| 2021/0290191 A1* | 9/2021 | Qi ........................ | G06N 3/08 |

FOREIGN PATENT DOCUMENTS

| | | |
|---|---|---|
| JP | 9-122096 A | 5/1997 |
| JP | 11-33011 A | 2/1999 |
| JP | 2015-181840 A | 10/2015 |
| JP | 2017-6929 A | 1/2017 |
| JP | 2018-206382 A | 12/2018 |
| WO | WO 2005/091011 A1 | 9/2005 |

OTHER PUBLICATIONS

U.S. Appl. No. 62/991,269 drawings, Mar. 18, 2020. (Year: 2020).*
Extended European Search Report issued Jun. 4, 2020 in European Patent Application No. 20169009.6, citing documents AA, AO, and AX through AZ therein, 10 pages.
Arcan Ertürk, M., et al., "Denoising MRI Using Spectral Subtraction", IEEE Transactions on Biomedical Engineering, vol. 60, No. 6, Jun. 1, 2013, XP011509821, pp. 1556-1562.
Madore, B., "Using Unfold to Remove Artifacts in Parallel Imaging and in Partial-Fourier Imaging", Magnetic Resonance in Medicine, vol. 48, No. 3, Sep. 1, 2002, XP001124773, pp. 493-501.
Otazo, R., et al., "Combination of Compressed Sensing and Parallel Imaging for Highly Accelerated First-Pass Cardiac Perfusion MRI", Magnetic Resonance in Medicine, vol. 64, No. 3, Jun. 9, 2010, XP055236486, pp. 767-776.
Japanese Office Action issued Jun. 19, 2024 in Japanese Patent Application No. 2023-175119, 4 pages.

* cited by examiner

CALCULATE DENOISING INTENSITY (NoiseSD)
NoiseSD = NoiseSD_map*C/C_map*α

DENOISING PROCESS USING DENOISING INTENSITY

FILTER INPUT IMAGE (RECONSTRUCTION IMAGE)

DENOISING IMAGE

FIG.5

CALCULATE TEMPORARY DENOISING INTENSITY (NoiseSDtmp) (S11)
NoiseSDtmp = NoiseSD_map*C/C_map SET THRESHOLD BASED ON TEMPORARY DENOISING INTENSITY (S12)
LOWER LIMIT: 0.0
UPPER LIMIT: 3*NoiseSDtmp EXTRACT, FROM EACH FILTER INPUT IMAGE, PIXEL OF WHICH SIGNAL INTENSITY FALLS WITHIN RANGE OF THRESHOLD (S13)

MULTIPLY STANDARD DEVIATION OF EXTRACTED PIXELS BY ADJUSTMENT FACTOR (α) TO CALCULATE DENOISING INTENSITY "NoiseSD" (S14)

DENOISING PROCESS USING DENOISING INTENSITY (S15)

FILTER INPUT IMAGE (RECONSTRUCTION IMAGE)

DENOISING IMAGE

MEDICAL INFORMATION PROCESSING APPARATUS AND MEDICAL INFORMATION PROCESSING METHOD

CROSS-REFERENCE TO RELATED APPLICATIONS

This application is a divisional of U.S. Application Ser. No. 16/845,176, filed on Apr. 10, 2020, which is based upon and claims the benefit of priority from Japanese Patent Application No. 2019-075110, filed on Apr. 10, 2019 and Japanese Patent Application No. 2020-069908, filed on Apr. 8, 2020; the entire contents of all of which are incorporated herein by reference.

FIELD

Embodiments described herein relate generally to a medical information processing apparatus and a medical information processing method.

BACKGROUND

In recent years, the method called a shrinkage method has been known as a denoising process applicable to magnetic resonance imaging (MRI). In this method, the denoising intensity (the amount of noise) included in an image is estimated, and a threshold for the denoising process is determined based on the estimated denoising intensity. In order to ensure the denoising performance, the denoising intensity included in the image needs to be estimated with high accuracy.

DETAILED DESCRIPTION

An object according to an embodiment is to provide a medical information processing apparatus and a medical information processing method with which it is possible to accurately estimate a denoising intensity.

A medical information processing apparatus provided according to an embodiment includes processing circuitry. The processing circuitry calculates the noise intensity from first data acquired during the first scan. The processing circuitry calculates a denoising intensity used for a denoising process based on the noise intensity and the difference between an imaging condition for the first scan and an imaging condition for the second scan, the denoising process being applied to second data obtained by the second scan.

With reference to the accompanying drawings, a medical information processing apparatus and a medical information processing method according to an embodiment are described below. Embodiments are not limited to the following embodiments. The content described in one embodiment are also applicable to other embodiments in principle.

First Embodiment

Figure 1:
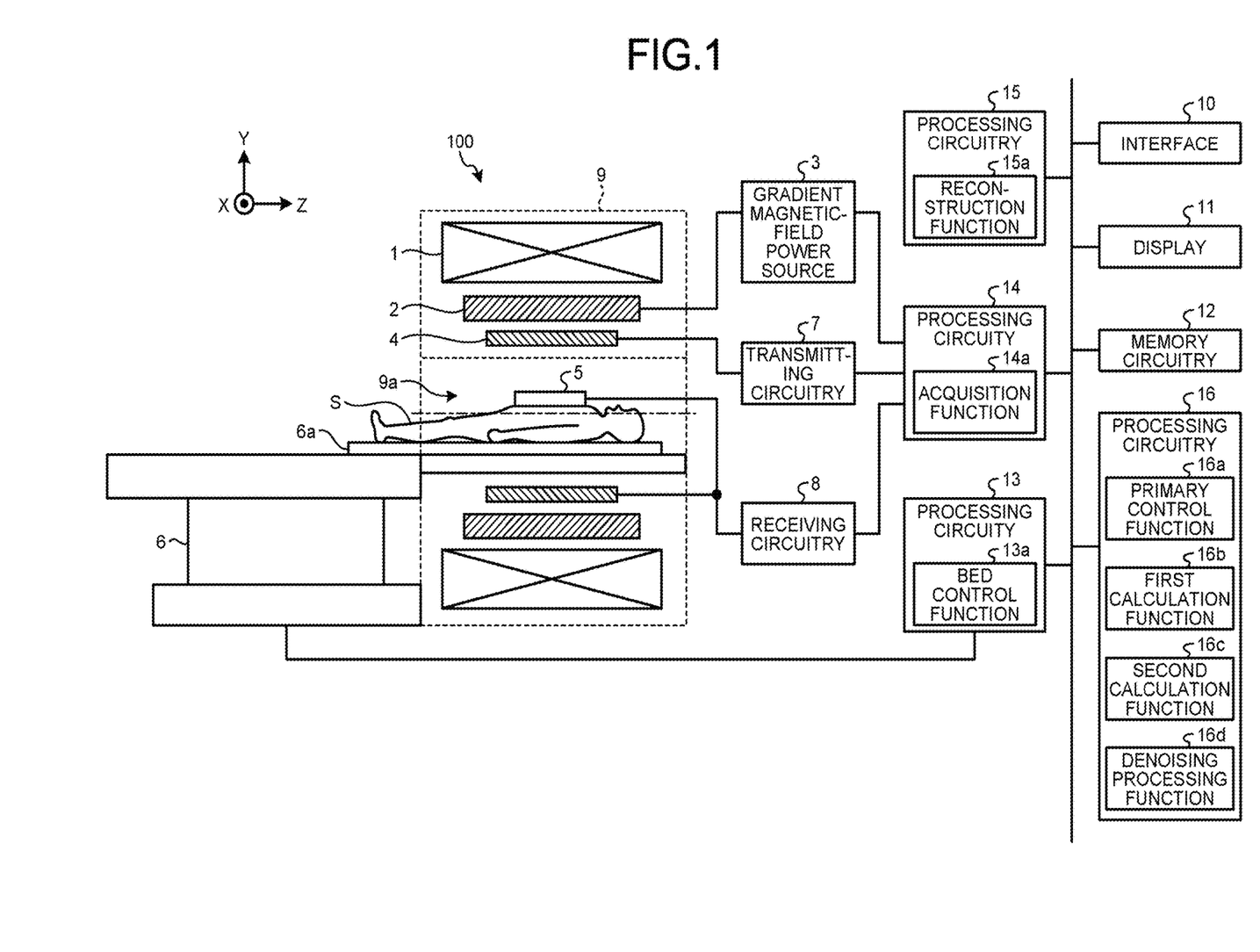
FIG. 1 is a diagram illustrating an example of the overall configuration of an MRI apparatus according to a first embodiment.

FIG. 1 is a diagram illustrating an example of the overall configuration of an MRI apparatus 100 according to a first embodiment. For example, as illustrated in FIG. 1, the MRI apparatus 100 according to the present embodiment includes a static magnet 1, a gradient coil 2, a gradient magnetic-field power source 3, a whole body (WB) coil 4, a receiving coil device 5, a bed 6, a transmitting circuitry 7, a receiving circuitry 8, a gantry 9, an interface 10, a display 11, a memory circuitry 12, and processing circuitries 13, 14, 15, and 16. The MRI apparatus 100 does not include a subject S (e.g., a human body). The MRI apparatus 100 is an example of a medical information processing apparatus.

Specifically, the static magnet 1 is formed into substantially a cylindrical shape (including the one that has an elliptical shape in cross-section perpendicular to the center axis) with a hollow to generate a static magnetic field in the imaging space formed on the inner circumference side. The static magnet 1 includes, for example, a cooling container formed in substantially a cylindrical shape and a magnet, such as a superconducting magnet, immersed in a coolant (e.g., liquid helium) filled in the cooling container. The static magnet 1 may generate a static magnetic field by using, for example, a permanent magnet.

The gradient coil 2 generates a gradient magnetic field in the imaging space where the subject S is placed. Specifically, the gradient coil 2 is formed into substantially a cylindrical shape (including the one that has an elliptical shape in cross-section perpendicular to the center axis) with a hollow and includes a plurality of gradient coils having substantially a cylindrical shape and laminated in a radial direction. The gradient coils generate gradient magnetic fields along the directions of the respective axes, i.e., the X-axis, the Y-axis, and the Z-axis that are orthogonal to each other, in the imaging space formed on the inner circumference side based on the current supplied from the gradient magnetic-field power source 3.

More specifically, the gradient coil 2 includes an X coil that generates a gradient magnetic field along the X-axis direction, a Y coil that generates a gradient magnetic field along the Y-axis direction, and a Z coil that generates a gradient magnetic field along the Z-axis direction. The X-axis, the Y-axis, and the Z-axis constitute an apparatus coordinate system unique to the MRI apparatus 100. For example, the X-axis is set in a horizontal direction perpendicular to the center axis of the gradient coil 2, and the Y-axis is set in a vertical direction perpendicular to the center axis of the gradient coil 2. Furthermore, the Z-axis is set along the center axis of the gradient coil 2.

The gradient magnetic-field power source 3 individually supplies the electric current to each of the X coil, the Y coil, and the Z coil included in the gradient coil 2 to generate gradient magnetic fields in the imaging space along each axis direction, i.e., the X-axis, Y-axis, and the Z-axis directions. Specifically, the gradient magnetic-field power source 3 supplies the electric current to the X coil, the Y coil, and the Z coil as appropriate to generate gradient magnetic fields along a read-out direction, a phase encoding direction, and a slice direction that are perpendicular to each other. The axis along the read-out direction, the axis along the phase encoding direction, and the axis along the slice direction constitute a logical coordinate system that defines a slice area or a volume area to be imaged.

In the example described below, the axis along the read-out direction, the axis along the phase encoding direction, and the axis along the slice direction, which constitute the logical coordinate system, correspond to the X-axis, the Y-axis, and the Z-axis, respectively, which constitute the apparatus coordinate system. However, the correspondence relationship between the logical coordinate system and the apparatus coordinate system is not limited thereto and may be changed as appropriate.

The gradient magnetic fields along the read-out direction, the phase encoding direction, and the slice direction are superimposed on the static magnetic field generated by the static magnet 1 so as to give the spatial position information to magnetic resonance (MR) signals generated from the subject S. Specifically, a gradient magnetic field Gro in the read-out direction changes the frequency of an MR signal in accordance with the position in the read-out direction to give the position information along the read-out direction to the MR signal. A gradient magnetic field Gpe in the phase encoding direction changes the phase of an MR signal along the phase encoding direction to give the position information along the phase encoding direction to the MR signal. A gradient magnetic field Gss in the slice direction gives the position information along the slice direction to the MR signal. For example, the gradient magnetic field Gss in the slice direction is used to determine the direction, the thickness, or the number of pieces of a slice area if the imaging area is a slice area and is used to change the phase of an MR signal in accordance with the position in the slice direction if the imaging area is a volume area.

The WB coil 4 is a radio frequency (RF) coil that is disposed inside the gradient coil 2 to function as a transmitting coil that applies an RF magnetic field to the imaging space where the subject S is placed and functions as a receiving coil that receives an MR signal generated from the subject S due to the effect of the RF magnetic field. Specifically, the WB coil 4 is formed in substantially a cylindrical shape (including the one that has an elliptical shape in cross-section perpendicular to the center axis of the cylinder) to apply an RF magnetic field to the imaging space formed in the cylinder based on a high-frequency pulse signal supplied from the transmitting circuitry 7. The WB coil 4 receives the MR signal generated from the subject S due to the effect of the RF magnetic field and outputs the received MR signal to the receiving circuitry 8.

The receiving coil device 5 is an RF coil that receives an MR signal generated from the subject S. For example, the receiving coil device 5 is prepared for each site of the subject S and is disposed near the target site to be captured when the subject S is captured. The receiving coil device 5 includes one or more independent coil elements (hereinafter also simply referred to as "elements") that receive MR signals generated from the subject S due to the effect of the RF magnetic field applied by the WB coil 4. The receiving coil device 5 amplifies the MR signal received by the element and outputs the MR signal to the receiving circuitry 8. The receiving coil device 5 may further function as a transmitting coil that applies an RF magnetic field to the subject S. In this case, the receiving coil device 5 is coupled to the transmitting circuitry 7 so as to apply an RF magnetic field to the subject S based on an RF pulse signal supplied from the transmitting circuitry 7.

The bed 6 includes a top plate 6a on which the subject S is placed so that the top plate 6a where the subject S is placed is moved in the imaging space when the subject S is captured. For example, the bed 6 is disposed such that the longitudinal direction of the top plate 6a is parallel to the center axis of the static magnet 1.

The transmitting circuitry 7 outputs, to the WB coil 4, the RF pulse signal corresponding to the resonance frequency (Larmor frequency) unique to the target atomic nucleus placed in the static magnetic field. Specifically, the transmitting circuitry 7 includes a pulse generator, an RF generator, a modulator, and an amplifier. The pulse generator generates the waveform of an RF pulse signal. The RF generator generates an RF signal at the resonance frequency. The modulator modulates the amplitude of the RF signal generated by the RF generator with the waveform generated by the pulse generator to generate an RF pulse signal. The amplifier amplifies the RF pulse signal generated by the modulator and outputs the amplified RF pulse signal to the WB coil 4.

The receiving circuitry 8 generates MR signal data based on the MR signal received by the WB coil 4 or the receiving coil device 5. Then, the receiving circuitry 8 outputs the generated MR signal data to the processing circuitry 14. The gantry 9 includes a hollow bore 9a formed in substantially a cylindrical shape (including the one that has an elliptical shape in cross-section perpendicular to the center axis) to support the static magnet 1, the gradient coil 2, and the WB coil 4. Specifically, the gantry 9 supports the static magnet 1, the gradient coil 2, and the WB coil 4 in a state where the gradient coil 2 is disposed on the inner circumference side of the static magnet 1, the WB coil 4 is disposed on the inner circumference side of the gradient coil 2, and the bore 9a is disposed on the inner circumference side of the WB coil 4. The space within the bore 9a included in the gantry 9 is the imaging space where the subject S is placed when the subject S is captured.

In the example described here, the MRI apparatus 100 has what is called a tunnel configuration in which the static magnet 1, the gradient coil 2, and the WB coil 4 are formed to have substantially a cylindrical shape; however, the embodiment is not limited thereto. For example, the MRI apparatus 100 may have what is called an opened configuration in which a pair of static magnets, a pair of gradient coil units, and a pair of RF coils are disposed to face each other with the imaging space where the subject S is placed interposed therebetween. In this case, the space sandwiched between the pair of static magnets, the pair of gradient coil units, and the pair of RF coils corresponds to a bore in the tunnel structure.

The interface 10 receives input operations of various instructions and various kinds of information from the operator. Specifically, the interface 10 is coupled to the processing circuitry 16 to convert an input operation received from the operator into an electric signal and outputs the electric signal to the processing circuitry 16. For example, the interface 10 is implemented by using a track ball for setting, for example, an imaging condition or a region of interest (ROI), a switch button, a mouse, a keyboard, a touch pad for performing an input operation with the touch on an operating surface, a touch screen in which a display screen and a touch pad are integrated, a non-contact input circuitry using an optical sensor, or a voice input circuitry. In this description, the interface 10 is not limited to the one including a physical operating component such as a mouse or a keyboard. Examples of the interface 10 include an electric signal processing circuitry that receives an electric signal corresponding to the input operation from an external input device provided separately from the apparatus and outputs the electric signal to a control circuitry.

The display 11 presents various kinds of information and images. Specifically, the display 11 is coupled to the processing circuitry 16 to convert various types of information or image data transmitted from the processing circuitry 16 into an electric signal for display and output the electric signal. The display 11 is implemented by using, for example, a liquid crystal monitor, a cathode ray tube (CRT) monitor, or a touch panel.

The memory circuitry 12 stores various types of data. Specifically, the memory circuitry 12 stores MR signal data and image data. The memory circuitry 12 is implemented by using, for example, a semiconductor memory device such as a random access memory (RAM) or a flash memory, a hard disk, or an optical disk.

The processing circuitry 13 includes a bed control function 13a. The bed control function 13a outputs a control electric signal to the bed 6 so as to control the operation of the bed 6. For example, the bed control function 13a receives the operator's instruction for moving the top plate 6a in the longitudinal direction, the vertical direction, or the lateral direction via the interface 10 and operates the movement mechanism of the top plate 6a of the bed 6 so that the top plate 6a is moved in accordance with the received instruction.

The processing circuitry 14 includes an acquisition function 14a. The acquisition function 14a executes various pulse sequences to acquire MR signal data on the subject S. Specifically, the acquisition function 14a drives the gradient magnetic-field power source 3, the transmitting circuitry 7, and the receiving circuitry 8 in accordance with the sequence execution data output from the processing circuitry 16 to execute the pulse sequence. The sequence execution data is data representing a pulse sequence and is information that defines the timing at which the gradient magnetic-field power source 3 supplies an electric current to the gradient coil 2, the intensity of the supplied electric current, the timing at which the transmitting circuitry 7 supplies an RF pulse signal to the WB coil 4, the intensity of the supplied RF pulse signal, or the timing at which the receiving circuitry 8 detects an MR signal. The acquisition function 14a receives MR signal data from the receiving circuitry 8 as a result of the pulse sequence execution and stores the received MR signal data in the memory circuitry 12. The set of MR signal data received by the acquisition function 14a is arranged in two dimensions or three dimensions in accordance with the position information given by the read-out gradient magnetic field, the phase encoding gradient magnetic field, and the slice gradient magnetic field described above so as to be stored as the data forming the k-space in the memory circuitry 12.

The processing circuitry 15 includes a reconstruction function 15a. The reconstruction function 15a generates image data based on the MR signal data stored in the memory circuitry 12. Specifically, the reconstruction function 15a reads MR signal data stored in the memory circuitry 12 by using the acquisition function 14a and performs post-processing, i.e., reconstruction processing such as Fourier transform (FT), on the read MR signal data to generate image data. The reconstruction function 15a stores the generated image data in the memory circuitry 12.

The processing circuitry 16 includes a primary control function 16a, a first calculation function 16b, a second calculation function 16c, and a denoising processing function 16d. The primary control function 16a controls each component included in the MRI apparatus 100 to perform the overall control of the MRI apparatus 100. Specifically, the primary control function 16a causes the display 11 to present a graphical user interface (GUI) that receives an input operation of various types of instructions and information from the operator. The primary control function 16a controls each component included in the MRI apparatus 100 in response to the input operation received via the interface 10. For example, the primary control function 16a receives the input of an imaging condition from the operator through the interface 10. The primary control function 16a generates sequence execution data based on the received imaging condition and transmits the sequence execution data to the processing circuitry 14 so as to execute various pulse sequences. For example, in response to a request from the operator, the primary control function 16a reads image data from the memory circuitry 12 and outputs the image data to the display 11. The first calculation function 16b, the second calculation function 16c, and the denoising processing function 16d are described later.

The above-described processing circuitries 13, 14, 15, and 16 are implemented by using for example a processor. In this case, for example, the processing function provided by each processing circuitry is stored in the memory circuitry 12 in the form of a program executable by a computer. Each processing circuitry reads and executes each program from the memory circuitry 12 to perform the function corresponding to each program. Each processing circuitry may be configured by using a plurality of processors so that each of the processors executes a program to perform each processing function. The processing function provided by each processing circuitry may be performed by being separated or combined in one or more processing circuitries as appropriate. The single memory circuitry 12 stores the program corresponding to each processing function in this description; however, a configuration may be such that a plurality of memory circuitries is distributed so that processing circuitry reads the corresponding program from an individual memory circuitry.

The configuration of the MRI apparatus 100 according to the first embodiment has been described above. With the above-described configuration, the MRI apparatus 100 performs the following processing function in order to estimate the denoising intensity with high accuracy.

The MRI apparatus 100 according to the first embodiment enables the high-speed imaging using parallel imaging (PI). For example, the PI uses the fact that the sensitivity is different depending on the arrangement of coils so that the k-space data is simultaneously captured and decimated by a plurality of coils and an image (reconstruction image) is generated from the obtained k-space data while artifacts are suppressed. In the example described below, the PI is executed; however, embodiments are not limited thereto.

Figure 2:
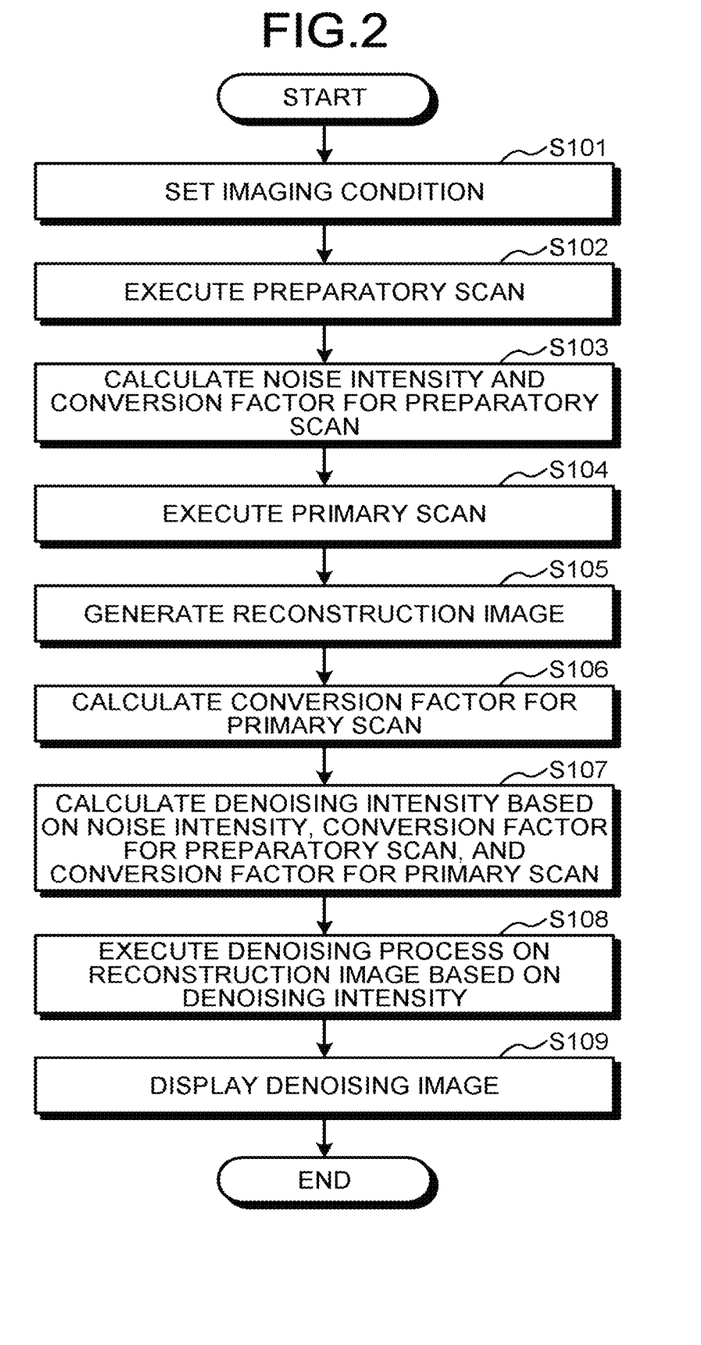
FIG. 2 is a flowchart illustrating the steps of a process performed by the MRI apparatus according to the first embodiment.

With reference to FIG. 2, the steps of a process performed by the MRI apparatus 100 according to the first embodiment are described. FIG. 2 is a flowchart illustrating the steps of a process performed by the MRI apparatus 100 according to the first embodiment. The steps of the process illustrated in FIG. 2 are started in response to, for example, an imaging start request input by the operator.

Figure 3:
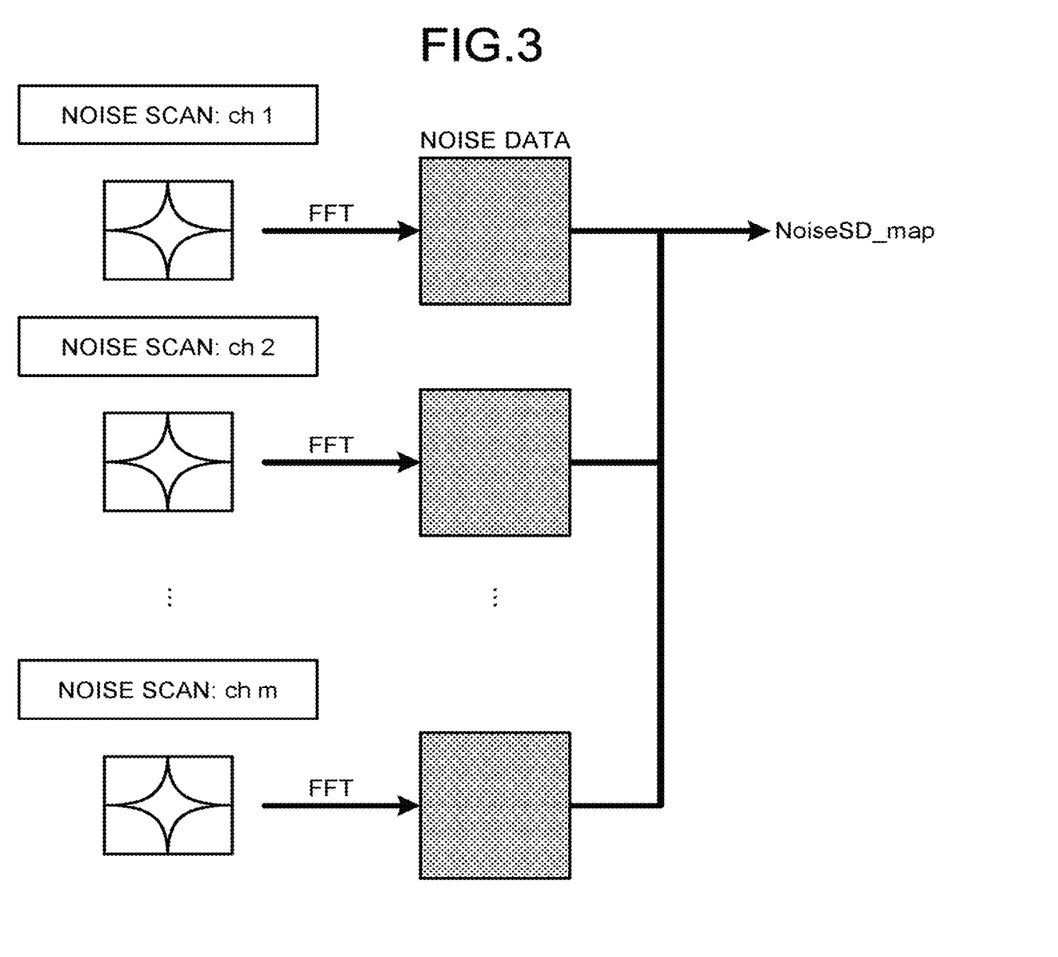
FIG. 3 is a diagram illustrating a processing function of the MRI apparatus according to the first embodiment.
Figure 4:
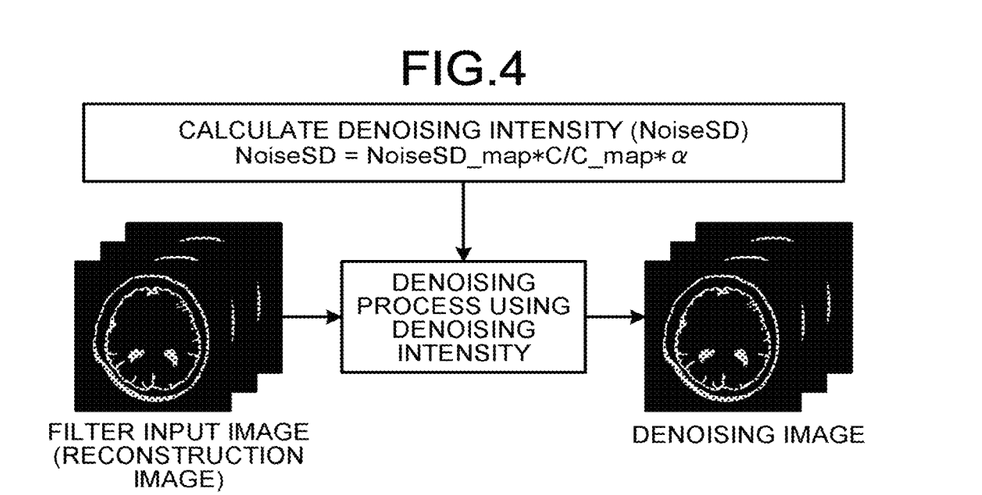
FIG. 4 is a diagram illustrating a processing function of the MRI apparatus according to the first embodiment.

With reference to FIGS. 3 and 4, FIG. 2 is described. FIGS. 3 and 4 are diagrams illustrating a processing function of the MRI apparatus 100 according to the first embodiment.

As illustrated in FIG. 2, the primary control function 16a sets an imaging condition (Step S101). For example, the primary control function 16a receives the input of an imaging condition from the operator via the interface 10. The primary control function 16a generates sequence execution data based on the received imaging condition and transmits the generated sequence execution data to the acquisition function 14a.

Subsequently, the acquisition function 14a executes the preparatory scan (Step S102). For example, the acquisition function 14a drives the gradient magnetic-field power source 3, the transmitting circuitry 7, and the receiving circuitry 8 in accordance with the sequence execution data output from the primary control function 16a to execute the preparatory scan. Examples of the preparatory scan include the scan for acquiring an image for positioning, the shimming scan for correcting the non-uniformity of a static magnetic field, or the scan (sensitivity map scan) for acquiring a sensitivity map.

During the sensitivity map scan, the acquisition function 14a acquires "noise data" and "coil sensitivity information". For example, the acquisition function 14a performs the noise scan that is the scan without applying an RF magnetic field on the WB coil 4 and each element to acquire "noise data". Typically, the noise data is used to calculate the noise gain for correcting the deviation between the signal values of channels obtained during the noise scan and the noise matrix indicating the correlation between elements. The acquisition function 14a individually performs the scan on the WB coil 4 and each element. The acquisition function 14a compares the information (or image data) scanned by the WB coil 4 with the information (or image data) scanned by each element to generate "coil sensitivity information" on each element.

In order to acquire only the noise data, it is preferable to perform the noise scan without transmitting an RF pulse. However, an RF pulse may be applied as long as a generated nuclear magnetic resonance (NMR) signal (MR signal) does not affect the estimation of the amount of noise. For example, an RF pulse having an extremely small flip angle may be applied during the noise scan.

In other words, the preparatory scan includes the scan that acquires noise data without transmitting an RF pulse having more than a certain intensity. The RF pulse having more than a certain intensity is an RF pulse such that a generated NMR signal affect the estimation of the amount of noise.

The first calculation function 16b calculates the noise intensity and the conversion factor for the preparatory scan (Step S103). For example, the first calculation function 16b calculates the noise intensity from the noise data acquired during the preparatory scan.

With reference to FIG. 3, the process to calculate the noise intensity is described. As illustrated in FIG. 3, for example, the reconstruction function 15a performs Fast Fourier Transform (FFT) on the acquired data on each channel (each element), which is acquired during the noise scan, to generate noise data that is data in the real space. The first calculation function 16b calculates the complex average value and the standard deviation of each pixel value in the noise data on all the slices and all the channels through the complex arithmetic. The first calculation function 16b outputs the thus calculated standard deviation as a noise intensity "NoiseSD map". That is, the first calculation function 16b calculates the noise intensity based on data obtained by transforming the k-space data acquired during the preparatory scan into the real-space data.

The first calculation function 16b calculates a conversion factor for the preparatory scan based on the imaging condition for the preparatory scan. The conversion factor is a factor for adjusting the difference between the imaging condition for the preparatory scan and the imaging condition for the main scan. The conversion factor for the preparatory scan (for the sensitivity map scan) is an example of a first conversion factor.

For example, the first calculation function 16b uses the following Equation (1) to calculate the conversion factor for the preparatory scan. In Equation (1), Rg represents a signal amplification gain in the receiving circuitry 8. Nex represents the number of averages in the k-space. Nx represents the matrix size in the frequency encoding direction. Ny represents the matrix size in the phase encoding direction. Nz represents the number of slice encoding for 3DFT. BW represents the bandwidth per pixel (BW=Bandwidth/Nx). Further, g is the factor indicating an amplification gain of the noise component by the unfolding process during parallel imaging. A represents the acceleration factor of high-speed imaging using compressed sensing (CS).

$$CONVERSIONFACTOR = g * A * \frac{Rg * Nx * \sqrt{BW * Ny * Nz}}{\sqrt{Nex}} \quad (1)$$

The parameters Rg, Nex, Nx, Ny, Nz, BW, g, and A included in Equation (1) may be acquired from the imaging condition. That is, the first calculation function 16b acquires the parameters Rg, Nex, Nx, Ny, Nz, BW, g, and A from the imaging condition for the preparatory scan. Then, the first calculation function 16b applies each of the acquired parameters to Equation (1) to calculate a conversion factor "C_map" for the preparatory scan.

As described above, the first calculation function 16b calculates the noise intensity "NoiseSD_map" and the conversion factor "C_map" for the preparatory scan. FIG. 3 and Equation (1) are merely examples, and embodiments are not limited thereto. For example, the conversion factor may be multiplied by any coefficient. Equation (1) described above is not exclusively applied to 3DFT or CS. For example, in the case of 2DFT, Nz is "1". Furthermore, in the case where CS is not applied, A is "1".

The acquisition function 14a executes the main scan (Step S104). For example, the acquisition function 14a drives the gradient magnetic-field power source 3, the transmitting circuitry 7, and the receiving circuitry 8 in accordance with the sequence execution data output from the primary control function 16a to execute the main scan. The main scan is, for instance, scan for generating a diagnostic image.

The reconstruction function 15a generates a reconstruction image (Step S105). For example, the reconstruction function 15a uses the sensitivity map to generate an unfolded image (reconstruction image) from MR signals acquired during the main scan. The reconstruction function 15a stores the reconstructed image data in the memory circuitry 12. The thus generated reconstruction image is image data before a denoising process.

The first calculation function 16b calculates the conversion factor for the main scan (Step S106). For example, the first calculation function 16b calculates the conversion factor for the main scan based on the imaging condition for the main scan. The conversion factor for the main scan is an example of a second conversion factor. For example, the first calculation function 16b acquires the parameters Rg, Nex, Nx, Ny, Nz, BW, g, and A from the imaging condition for the main scan. The first calculation function 16b applies the acquired parameters to Equation (1) to calculate a conversion factor "C" for the main scan.

The second calculation function 16c calculates the denoising intensity based on the noise intensity, the conversion factor for the preparatory scan, and the conversion factor for the main scan (Step S107). The denoising processing function 16d executes a denoising process on a reconstruction image based on the denoising intensity (Step S108).

With reference to FIG. 4, the denoising intensity calculation process and the denoising process are described. For example, the second calculation function 16c acquires the noise intensity "NoiseSD map", the conversion factor "C_map" for the preparatory scan, and the conversion factor "C" for the main scan, calculated by the first calculation function 16b. The second calculation function 16c applies the acquired parameters to the equation illustrated in FIG. 4 to calculate a denoising intensity "NoiseSD". In the equation (NoiseSD=NoiseSD map*C/C_map*α) illustrated in FIG. 4, α is an adjustment factor.

In other words, the second calculation function 16c calculates the denoising intensity based on the noise intensity, the first conversion factor corresponding to the imaging condition for the preparatory scan, and the second conversion factor corresponding to the imaging condition for the main scan. Specifically, the second calculation function 16c calculates the denoising intensity based on the value obtained by multiplying the noise intensity by the ratio of the second conversion factor to the first conversion factor.

The denoising processing function 16d uses the reconstruction image acquired during the main scan as a filter input image and executes the denoising process using the shrinkage method that uses the denoising intensity "NoiseSD". For the denoising process using the shrinkage method, any known technique may be selected and applied. For example, the denoising processing function 16d uses the denoising intensity to determine the threshold for the denoising process using the shrinkage method. The denoising processing function 16d uses the determined threshold to perform the denoising process. Thus, the denoising processing function 16d generates the denoised image that is obtained after noise is removed from the reconstruction image.

As described above, the second calculation function 16c calculates the denoising intensity used for the denoising process based on the noise intensity and the difference between the imaging condition for the preparatory scan and the imaging condition for the main scan, the denoising process being applied to data obtained by the main scan. The denoising processing function 16d performs the denoising process on the reconstruction image acquired during the main scan based on the denoising intensity calculated by the second calculation function 16c.

The primary control function 16a causes the denoised image to be displayed (Step S109). For example, the primary control function 16a causes the display 11 to present the denoised image stored in the memory circuitry 12. To display the denoised image, the primary control function 16a may use a known image processing technique such as a rendering process as appropriate.

The steps of the process described in FIG. 2 are merely an example, and the details illustrated in FIG. 2 are not a limitation. For example, the MRI apparatus 100 may shuffle and execute the steps of the process as appropriate as long as the consistency is ensured for the details of the process. For example, the calculation operation at Step S103 is not necessarily performed immediately after the operation at Step S102 as long as the calculation operation at Step S103 is completed before the operation at Step S107. For example, the calculation operation at Step S103 may be executed simultaneously with the calculation operation at Step S106. For example, the reconstruction operation at Step S105 is not necessarily performed immediately after the operation at Step S104 as long as the reconstruction operation at Step S105 is completed before the operation at Step S108.

As described above, in the MRI apparatus 100 according to the first embodiment, the first calculation function 16b calculates the noise intensity from the noise data acquired during the preparatory scan. The second calculation function 16c calculates the denoising intensity used for the denoising process from the noise intensity based on the difference between the imaging condition for the preparatory scan and the imaging condition for the main scan. Thus, the MRI apparatus 100 may estimate the denoising intensity with high accuracy. As a result, the MRI apparatus 100 may generate a high-quality reconstruction image from which noise has been removed with high accuracy.

The MRI apparatus 100 may execute the above-described denoising intensity calculation process without adding a special scan. Thus, the MRI apparatus 100 may accurately estimate the denoising intensity while minimizing the extension of an examination time.

Modified Example 1 of the First Embodiment

Although the PI is executed in the example described in the first embodiment, embodiments are not limited thereto. For example, even though the PI is not executed, the MRI apparatus 100 may perform an additional noise scan to perform the above-described denoising intensity calculation process. For example, when the PI is not executed, the MRI apparatus 100 performs the above-described process by using Equation (1) in which "g" (the factor indicating an amplification gain of the noise component by the unfolding process during parallel imaging) is "1".

Modified Example 2 of the First Embodiment

Although the denoising intensity of the main scan is calculated based on the noise intensity and a difference between an imaging condition for the preparatory scan and an imaging condition for a main scan in the example described in the first embodiment, embodiments are not limited thereto. For example, the scan does not need to be "preparatory scan" n if it is the scan that can calculate the noise intensity. In this case, the denoising intensity is calculated based on the noise intensity and the difference between an imaging condition for a main scan "A" to be calculated the noise intensity and an imaging condition for a main scan "B" performing the denoising process.

In addition, the main scan "A" may be described as "a first scan". Data acquired during the first scan may be described as "first data". The main scan "B" may be described as "a second scan". Data acquired during the second scan may be described as "second data".

Modified Example 3 of the First Embodiment

Although the preparatory scan is carried out before the main scan in the example described in the first embodiment, embodiments are not limited thereto. For example, the scan (corresponding to preparatory scan) to calculate the noise intensity may be carried out after the main scan. In other words, the scan to calculate the noise intensity may be a scan to be carried out independently by the main scan.

Second Embodiment

In the example described in the first embodiment, the conversion value of the noise intensity of noise data is used as a denoising intensity; however, embodiments are not limited thereto. The MRI apparatus 100 according to the second embodiment may estimate the denoising intensity based on the pixel value in the background area of a reconstruction image acquired during the main scan.

Although the MRI apparatus 100 according to the second embodiment has the same configuration as that of the MRI apparatus 100 illustrated in FIG. 1, the MRI apparatuses 100 are different in part of the process by the second calculation function 16c and part of the process by the denoising processing function 16d. In the second embodiment, a difference from the first embodiment is described.

Figure 5:
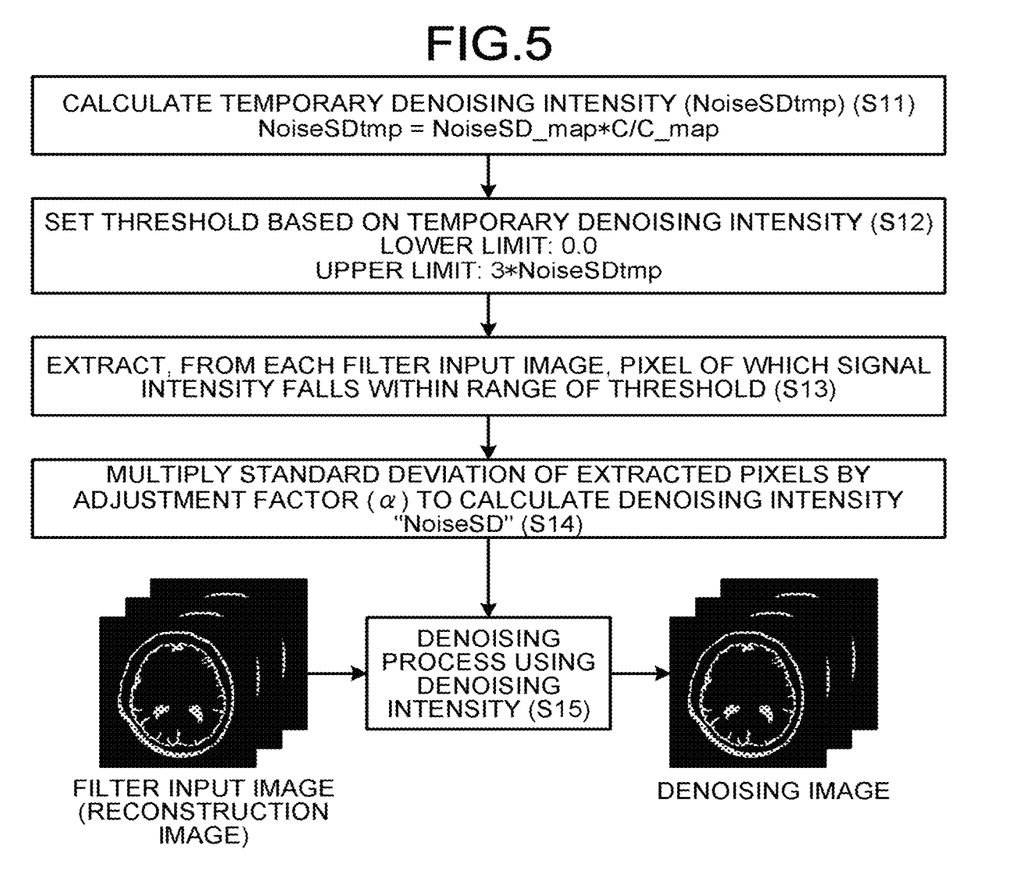
FIG. 5 is a diagram illustrating a processing function of the MRI apparatus according to a second embodiment.

FIG. 5 is a diagram illustrating a processing function of the MRI apparatus 100 according to the second embodiment. As illustrated in FIG. 5, the second calculation function 16c acquires the noise intensity "NoiseSD map" calculated by the first calculation function 16b, the conversion factor "C_map" for the preparatory scan, and the conversion factor "C" for the main scan. The second calculation function 16c applies the acquired parameters to the equation (NoiseSDtmp=NoiseSD_map*C/C_map) illustrated in FIG. 5 to calculate the temporary denoising intensity "NoiseSDtmp" (S11).

The temporary denoising intensity corresponds to the value obtained by calculating the "denoising intensity (NoiseSD)" described in the first embodiment with the adjustment factor (a) of "1". That is, the noise intensity "NoiseSD map" used for calculating the temporary denoising intensity is a value calculated during the process of the first calculation function 16b according to the first embodiment (see FIG. 3). The "temporary denoising intensity" may be the value obtained by multiplication using a number other than "1" as the adjustment factor. Thus, the temporary denoising intensity is substantially the same parameter as the denoising intensity described in the first embodiment except that the temporary denoising intensity is not directly used during the denoising process.

The second calculation function 16c sets a threshold based on the temporary denoising intensity (S12). The threshold corresponds to the range of pixel values for specifying the background area in the reconstruction image. For example, the second calculation function 16c sets "0.0" as the lower limit of the threshold. The second calculation function 16c sets "P*NoiseSDtmp" as the upper limit of the threshold. The value of P is determined in consideration of a noise distribution. For example, in the case of a normal distribution, "3" is selected as the value of P so that 95% of the distribution is included.

The second calculation function 16c extracts, from filter input image (reconstruction image), a pixel of which the magnitude of the signal intensity (pixel value) is within the range of the threshold (S13). The extracted pixel substantially corresponds to the background area of the reconstruction image.

The second calculation function 16c calculates the standard deviation of the pixel values of the extracted pixels through the complex arithmetic and multiplies the calculated standard deviation by the adjustment factor (a) to calculate the denoising intensity "NoiseSD" (S14). The denoising processing function 16d executes the denoising process using the shrinkage method with the denoising intensity "NoiseSD" on a filter input image (S15). Any known technique may be selected and applied to the denoising process using the shrinkage method. Thus, the denoising processing function 16d generates a denoised image obtained after noise has been removed from the reconstruction image.

As described above, in the MRI apparatus 100 according to the second embodiment, the second calculation function 16c determines the range of the signal value of the background area by using the denoising intensity and calculates the standard deviation of the pixel values of the background area in the reconstruction image. The denoising processing function 16d uses the calculated standard deviation to perform the denoising process. Thus, the MRI apparatus 100 may estimate the denoising intensity based on the pixel value of the background area in the reconstruction image acquired during the main scan.

That is, the second calculation function 16c specifies the background area of the reconstruction image by using the denoising intensity (temporary denoising intensity) and calculates the standard deviation of the pixel values of the pixels included in the specified background area. The denoising processing function 16d performs the denoising process using the calculated standard deviation.

For the MRI, originally, it is preferable that the denoising intensity is estimated from the "background area" in which the NMR signal is not included. Therefore, the MRI apparatus 100 according to the second embodiment does not directly use the "denoising intensity (NoiseSD)" described in the first embodiment but estimates the background area of the reconstruction image by using the "denoising intensity (NoiseSD)" as the "temporary denoising intensity (NoiseSDtmp)". The MRI apparatus 100 according to the second embodiment calculates the proper denoising intensity "NoiseSD" based on the pixel values of the pixels included in the estimated background area of the reconstruction image. Accordingly, the MRI apparatus 100 according to the second embodiment may calculate the denoising intensity more appropriately.

The description of FIG. 5 is merely an example, and embodiments are not limited thereto. For example, when the CS is applied, the second calculation function 16c may set the upper limit of the threshold in consideration of a regularization factor.

Other Embodiments

In addition to the embodiments described above, various different embodiments may be implemented.
Other Parameters indicating the Noise Intensity In the example described according to the above embodiment, the standard deviation is used as the noise intensity; however, embodiments are not limited thereto. The reason why the standard deviation is used in the above embodiment is that the noise distribution in an MR image (real-space image) conforms with a Gaussian distribution. For example, when the denoising process is performed in another space instead of the real space, the noise distribution may have a distribution that does not conform with a Gaussian distribution. In such a case, a different parameter (e.g., an average value or a statistical value) other than the standard deviation may be used as the noise intensity depending on the distribution.
Parameter of the Conversion Factor The parameters used to calculate the conversion factor are not limited to Rg, Nex, Nx, Ny, Nz, BW, g and A described in Equation (1). For example, when zero padding or zero filling is performed, the number of datasets to be filled with zero may be used as a parameter used to calculate the conversion factor. Zero filling is allocating the value "0" completely including no noise to the k-space. Therefore, the zero-filled k-space data seems to have a reduced amount of noise in accordance with the number of datasets filled with zero. For this reason, when zero filling is performed, it is preferable to adjust the conversion factor so as to be decreased in accordance with the number of datasets filled with zero.

In other words, the first calculation function 16b calculates the first conversion factor based on at least one of the following: the signal amplification gain in the receiving circuitry included in the imaging condition for the preparatory scan, the number of averages in the k-space, the matrix size in the frequency encoding direction, the matrix size in the phase encoding direction, the number of slice encoding, the bandwidth per pixel, the factor indicating the unfolding performance during parallel imaging, the acceleration factor of the high-speed imaging using the compressed sensing, and the number of datasets filled with zero.

Furthermore, the first calculation function 16b calculates the second conversion factor based on at least one of the following: the signal amplification gain in the receiving circuitry included in the imaging condition for the main scan, the number of averages in the k-space, the matrix size in the frequency encoding direction, the matrix size in the phase encoding direction, the number of slice encoding, the bandwidth per pixel, the factor indicating the unfolding performance during parallel imaging, the acceleration factor of the high-speed imaging using the compressed sensing, and the number of datasets filled with zero.

Medical Information Processing Apparatus

In the example described according to the above embodiment, the MRI apparatus 100 is applied as an example of the medical information processing apparatus; however, embodiments are not limited thereto. For example, an information processing apparatus such as a personal computer or a workstation may be used as the medical information processing apparatus.

In this case, processing circuitry of the medical information processing apparatus performs the processing functions that are similar to the first calculation function 16b, the second calculation function 16c, and the denoising processing function 16d. The medical information processing apparatus receives information such as the noise data, the imaging condition for the preparatory scan, and the imaging condition for the main scan from the MRI apparatus to execute each of the processing functions so as to calculate the denoising intensity.

The components of each device illustrated are conceptual in terms of functionality and do not necessarily need to be physically configured as illustrated in the drawings. Specifically, the specific forms of separation and combination of each device are not limited to those depicted in the drawings, and a configuration may be such that all or some of the devices are functionally or physically separated or combined in any unit depending on various types of loads or usage. All or any of various processing functions performed by each device may be implemented by a CPU and a program analyzed and executed by the CPU or may be implemented as wired logic hardware.

Among the processes described in the above embodiments, all or part of the processes that are automatically performed as described above may be performed manually. Furthermore, all or part of the processes that are manually performed as described above may be performed automatically by using a known method. Furthermore, the process steps, the control steps, the specific names, and the information including various types of data and parameters as described in the above description and the drawings may be optionally changed except as otherwise noted.

The medical information processing method described in the above embodiments may be implemented when a prepared medical information processing program is executed by a computer such as a personal computer or a workstation. The medical information processing program may be distributed via a network such as the Internet. The medical information processing method may be recorded in a computer-readable recording medium such as a hard disk, a flexible disk (FD), a CD-ROM, an MO, or a DVD and may be read from the recording medium by the computer so as to be executed.

According to at least one of the embodiments described above, it is possible to estimate the denoising intensity with high accuracy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A medical information processing apparatus comprising processing circuitry configured to:
   calculate an amount of noise included in first MR (magnetic resonance) data obtained by a first MR scan;
   acquire second MR data obtained by a second MR scan different from the first MR scan, an imaging condition of the second MR scan being different from an imaging condition of the first MR scan;
   calculate an amount of noise included in the second MR data based on the calculated amount of noise included in the first MR data, the imaging condition of the first MR scan, and the imaging condition of the second MR scan, without using the second MR data; and
   reduce noise included in the second MR data based upon the calculated amount of noise included in the second MR data.

2. The medical information processing apparatus according to claim 1, wherein the first MR data is acquired without applying an RF pulse in the first MR scan.

3. The medical information processing apparatus according to claim 1, wherein the imaging condition of the first MR scan comprises at least one of a signal amplification gain in receiving circuitry, a number of averages in a k-space, a matrix size in a frequency encoding direction, a matrix size in a phase encoding direction, a number of slice encoding, a bandwidth per pixel, a factor indicating an unfolding performance during parallel imaging, an acceleration factor of high-speed imaging using compressed sensing, and a number of datasets filled with zero.

4. The medical information processing apparatus according to claim 1, wherein the imaging condition of the second MR scan comprises at least one of a signal amplification gain in receiving circuitry, a number of averages in a k-space, a matrix size in a frequency encoding direction, a matrix size in a phase encoding direction, a number of slice encoding, and a bandwidth per pixel.

5. The medical information processing apparatus according to claim 4, wherein the imaging condition of the second MR scan further comprises a factor indicating an amplification gain of a noise component by an unfolding process during parallel imaging.

6. The medical information processing apparatus according to claim 4, wherein the imaging condition of the second MR scan further comprises an acceleration factor of high-speed imaging using compressed sensing.

7. The medical information processing apparatus according to claim 1, wherein the processing circuitry is further configured to reduce the noise included in the second MR data by using a neural network.

8. The medical information processing apparatus according to claim 1, wherein the processing circuitry is further configured to reduce the noise included in the second MR data by a denoising process using a shrinkage method.

9. The medical information processing apparatus according to claim 1, wherein the first MR data is acquired with applying an RF pulse in the first MR scan, an intensity of the RF pulse is less than an intensity of an RF pulse which is to be applied in the second MR scan.

10. The medical information processing apparatus according to claim 1, wherein the processing circuitry is further configured to reduce noise included in the second MR data based on the calculated amount of noise in the first MR data and a difference between the imaging condition of the first MR scan and the imaging condition of the second MR scan.

11. The medical information processing apparatus according to claim 10, wherein the processing circuitry is further configured to reduce noise included in the second MR data based on the calculated amount of noise in the first MR data, a first conversion factor corresponding to the imaging condition of the first MR scan, and a second conversion factor corresponding to the imaging condition of the second MR scan.

12. The medical information processing apparatus according to claim 11, wherein the processing circuitry is further configured to reduce noise included in the second MR data based on a value obtained by multiplying a value indicating the calculated amount of noise by a ratio between the second conversion factor and the first conversion factor.

13. The medical information processing apparatus according to claim 11, wherein the processing circuitry is further configured to calculate the first conversion factor based on at least one of the following:
a signal amplification gain in a receiving circuitry included in the imaging condition of the first MR scan, a number of averages in a k-space, a matrix size in a frequency encoding direction, a matrix size in a phase encoding direction, a number of slice encoding, a bandwidth per pixel, a factor indicating an unfolding performance during parallel imaging, an acceleration factor of high-speed imaging using compressed sensing, and a number of datasets filled with zero.

14. The medical information processing apparatus according to claim 11, wherein the processing circuitry is further configured to calculate the second conversion factor based on the following:
a signal amplification gain in a receiving circuitry included in the imaging condition of the second MR scan, a number of averages in a k-space, a matrix size in a frequency encoding direction, a matrix size in a phase encoding direction, a number of slice encoding, and a bandwidth per pixel.

15. The medical information processing apparatus according to claim 12, wherein the processing circuitry is further configured to calculate the second conversion factor based on a factor indicating an amplification gain of a noise component by an unfolding process during parallel imaging included in the imaging condition of the second MR scan.

16. The medical information processing apparatus according to claim 12, wherein the processing circuitry is further configured to calculate the second conversion factor based on an acceleration factor of high-speed imaging using compressed sensing included in the imaging condition of the second MR scan.

17. The medical information processing apparatus according to claim 1, wherein the processing circuitry is further configured to reduce noise included in the second MR data based on a threshold for a shrinkage method, the threshold being determined based on the calculated amount of noise, the imaging condition of the first MR scan, and the imaging condition of the second MR scan.

18. The medical information processing apparatus according to claim 1, wherein the processing circuitry is further configured to calculate the amount of noise included in first MR data based on data obtained by transforming the first MR data as k-space data into real-space data.

19. The medical information processing apparatus according to claim 1, wherein the second MR scan is a main scan for generating a diagnostic image, and
wherein the first MR scan is a scan carried out independently by the main scan.

* * * * *